US009454635B2

(12) United States Patent
Oberai (10) Patent No.: US 9,454,635 B2
(45) Date of Patent: Sep. 27, 2016

(54) VIRTUAL LAYER GENERATION DURING FAILURE ANALYSIS

(71) Applicant: Synopsys, Inc., Mountain View, CA (US)

(72) Inventor: Ankush Oberai, Fremont, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 14/604,694

(22) Filed: Jan. 24, 2015

(65) Prior Publication Data

US 2015/0213189 A1 Jul. 30, 2015

Related U.S. Application Data

(60) Provisional application No. 61/931,571, filed on Jan. 25, 2014.

(51) Int. Cl.
*G06F 17/50* (2006.01)
*H01L 27/02* (2006.01)

(52) U.S. Cl.
CPC ....... *G06F 17/5081* (2013.01); *H01L 27/0207* (2013.01)

(58) Field of Classification Search
CPC ........... G06F 17/5081; G06F 17/5068; G06F 17/50; G06F 17/5045; G06F 17/5022; G06F 17/5036; G06F 2217/12; G03F 1/36; G03F 7/705; G03F 7/70441; G03F 1/24; G03F 7/70433; G03F 1/70; G03F 7/70125; H01L 27/0207
USPC ..................................... 716/118–125, 50–56
See application file for complete search history.

(56) References Cited

U.S. PATENT DOCUMENTS

| | | |
|---|---|---|
| 6,275,971 B1 | 8/2001 | Levy |
| 6,969,837 B2 | 11/2005 | Ye |
| 7,149,989 B2 | 12/2006 | Lakshmanan et al. |
| 7,847,937 B1 | 12/2010 | Bevis |
| 7,873,204 B2 | 1/2011 | Wihl et al. |
| 7,873,585 B2 | 1/2011 | Izikson |
| 2005/0076316 A1* | 4/2005 | Pierrat ............... G06F 17/5036 716/52 |
| 2005/0235245 A1* | 10/2005 | Kotani ............... G06F 17/5081 716/52 |
| 2009/0287440 A1 | 11/2009 | Kulkarni |
| 2009/0310870 A1 | 12/2009 | Monkowski |
| 2010/0238433 A1 | 9/2010 | Lange et al. |
| 2010/0251202 A1* | 9/2010 | Pierrat ...................... G03F 1/36 716/50 |

* cited by examiner

*Primary Examiner* — Binh Tat
(74) *Attorney, Agent, or Firm* — Adams Intellex, PLC (57) ABSTRACT

A layout design for a semiconductor chip includes two or more layers, each including a set of shapes, which are used for various fabrication processes during the manufacture of a physical semiconductor chip. Some manufacturing processes create physical features on the semiconductor chip that do not directly correspond to shapes in the layout design. To facilitate design analysis of such semiconductor chips, shapes from the layout design are selected and manipulated by performing one or more operations, such as Boolean operations, on the shapes to generate new shapes. The new shapes, which can represent physical features of the manufactured semiconductor chip, are then displayed, along with an image of the corresponding section of the physical semiconductor chip, to facilitate design analysis, such as failure analysis.

24 Claims, 8 Drawing Sheets

VIRTUAL LAYER GENERATION DURING FAILURE ANALYSIS

RELATED APPLICATIONS

This application claims the benefit of U.S. provisional patent application "Virtual Layer Generation During Failure Analysis" Ser. No. 61/931,571, filed Jan. 25, 2014. The foregoing application is hereby incorporated by reference in its entirety.

FIELD OF ART

This application relates generally to semiconductor failure analysis and more particularly to failure analysis using a virtual layer generated from two or more mask layers.

BACKGROUND

Integrated circuit design and manufacture involves a multitude of steps, many of which are commonly performed using electronic design automation (EDA) tools running on a computer. Frequently, millions and even hundreds of millions of electronic devices, such as transistors, capacitors, resistors, and conductors, can exist on a single semiconductor chip. Each electronic device is composed of features, such as diffusion features, polysilicon features, contacts, metallization features, and other structures on a semiconductor die, each having various shapes and electrical characteristics. A layout design for an integrated circuit provides shapes for many different mask layers that are used to create the various physical features.

As technologies have advanced, smaller and smaller dimensions, or feature sizes, must be produced during the semiconductor production process in order to allow many more electronic devices to be created in the same amount of space on a semiconductor die than was formerly possible. Typically, some type of photo-lithography is used to create structures on the chip. One photo-lithographic technique for forming a set of structures in a particular layer of a chip is to deposit a layer of material on the chip and then to coat the layer with a photo-sensitive material. A light is then shined through a mask in which various shapes have been cut which, when the light is shined through the shapes, selectively expose desired patterns on areas of the photo-sensitive material not covered by the shapes in the mask. The exposed areas of the photo-sensitive material, along with the layer of material below those exposed areas in some cases, are then etched away. After the unexposed photo-sensitive material is removed, the desired structures remain.

As the feature sizes of integrated circuits have gotten smaller, in some cases even smaller than the wavelengths of the electromagnetic radiation (EMR) used in the lithographic processes, the challenge of fabricating features has forced the development of various techniques, such as multiple pattern lithography, which allow the creation of physical features that do not correspond to the shapes of any single mask layer. In some embodiments of double pattern lithography, the simplest variant of multiple pattern lithography, a line of sacrificial material is created, using a mask, on top of a layer of material to be patterned. The line of sacrificial material is covered with a spacer material and then the horizontal portions of the spacer material are etched away, leaving spacer material on the sides of the line of sacrificial material. The line of sacrificial material itself is then removed, leaving two lines of spacer material on top of the material to be patterned for each line of material that was created using the mask layer. The material to be patterned can then be etched, with the material under the lines of spacer material untouched, to create the patterning. The spacer material is then removed, leaving final features in the physical semiconductor chip that have no directly corresponding shapes in the layout design layers.

To perform some types of design analysis, such as failure analysis, actual physical structures on a semiconductor chip are examined to determine if the shapes were fabricated properly. If the fabricated structures correspond to shapes in a mask, it can be relatively easy to determine if the fabricated structures were created properly, simply by comparing the fabricated structure in question to a shape of the layout design. But if the fabricated structures do not directly correspond to shapes in one of the mask layers, it can prove much more difficult to determine if a physical structure has been created properly.

SUMMARY

A layout design of a semiconductor chip includes two or more layers, each including a set of shapes, which are used for various fabrication processes during the manufacture of a physical semiconductor chip. Some manufacturing processes create physical features on the semiconductor chip that do not directly correspond to shapes in the layout design. To facilitate design analysis of such semiconductor chips, shapes from the layout design are selected and manipulated by performing one or more operations, such as Boolean operations, on the shapes to generate new shapes. The new shapes, which can represent physical features of the manufactured semiconductor chip, are then displayed, along with an image of the corresponding section of the physical semiconductor chip in order to facilitate design analysis, such as failure analysis. A computer-implemented method for design analysis is disclosed comprising: obtaining a layout design for a semiconductor chip design; selecting a plurality of shapes from the layout design; manipulating the plurality of shapes by performing an operation on the plurality of shapes; generating a new shape based on the manipulating; and using the new shape in failure analysis of a semiconductor chip based on the semiconductor chip design.

The operation on the plurality of shapes can include a Boolean operation on the plurality of shapes. The new shape can be based on a manufacturing intent for the semiconductor chip design wherein the new shape is for a layer not included in the design layout but where the new shape substantially matches a physical shape seen during manufacturing.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Configuration Overview

In various types of design analysis, such as failure analysis, images of physical semiconductor chips are examined to determine whether or not a particular physical semiconductor chip was fabricated without defects. While not every type of defect can be detected with a visual examination using images from a visible light microscope or an electron microscope, many types of manufacturing defects, including lithography defects, contamination, and over/under-etching, can be detected by a visual examination. In many cases, however, an idealized image showing the desired structures on the semiconductor chip is helpful in determining the location and severity of potential defects by allowing a technician or automated process to compare the physical chip to the desired configuration and note defects in the actual chip. If the physical chip does not look like the expected image, the areas of difference represent possible defects.

Such an analysis methodology works well when the features of the physical chip directly correspond to shapes in the layout design, but some physical semiconductor chip features are created by types of fabrication processes that produce final shapes without direct correspondence to shapes on a mask layer. To be able to compare the microscopically produced image of the chip to an expected image for the same semiconductor chip made using such processes, it is necessary to employ methods for determining the expected image. Disclosed are embodiments for developing an expected image based on multiple shapes from a layout design. The expected image is generated by manipulating the shapes from the layout design to create a new shape which, in embodiments, corresponds to the expected shape for the fabricated chip. The manipulating can be performed using Boolean operations such as AND, OR, XOR, or MINUS (i.e. AND NOT). The manipulating can include other types of operations to simulate the effects of fabrication processes such as blooming, foreshortening, or misalignment between mask layers. The manipulating can include other types of operations in some embodiments, such as edge detection.

In some embodiments, a virtual mask layer is created based on known characteristics of a fabrication process. For example, mask layers created to aid in the analysis of a semiconductor chip can include a first mask layer to define shapes for a polysilicon layer and a second mask layer to define areas of the polysilicon to be removed in a later fabrication step. In this example, a virtual mask layer can be generated using an operation of the first mask layer MINUS the second mask layer to produce a conceptual image of polysilicon shapes left on the physical chip after manufacture. The conceptual mask image, or virtual mask, is then compared with an image of the physical chip to determine if the polysilicon shapes on the physical chip correspond to the shapes of the virtual mask. As another example, masks from a double pattern lithography process can be manipulated to generate new shapes for a virtual mask in order to represent expected shapes in the physical semiconductor chip. Further, in some instances virtual mask layer generation can be used to model intermediate shapes created when sacrificial shapes are included on design layers and later manipulated in order to create geometric features which will in turn be further modified to form final shapes on a chip. In embodiments, understanding the structure and appearance of such intermediate shapes can be useful in evaluating and generating the final expected shapes on a semiconductor chip.

Various electronic design automation (EDA) tools can be used to generate and show the new shapes. In some embodiments, one EDA tool is used to generate the new shapes and a second EDA tool is used to display the new shapes and the images of the physical chip. In other embodiments, a single EDA tool performs both the generating of the new shapes and the displaying of the new shapes and the images of the physical chip. In some embodiments, the EDA tool overlays the new shapes on the image of the physical chip to facilitate identification of non-matching shapes.

Further Details

Figure 1:
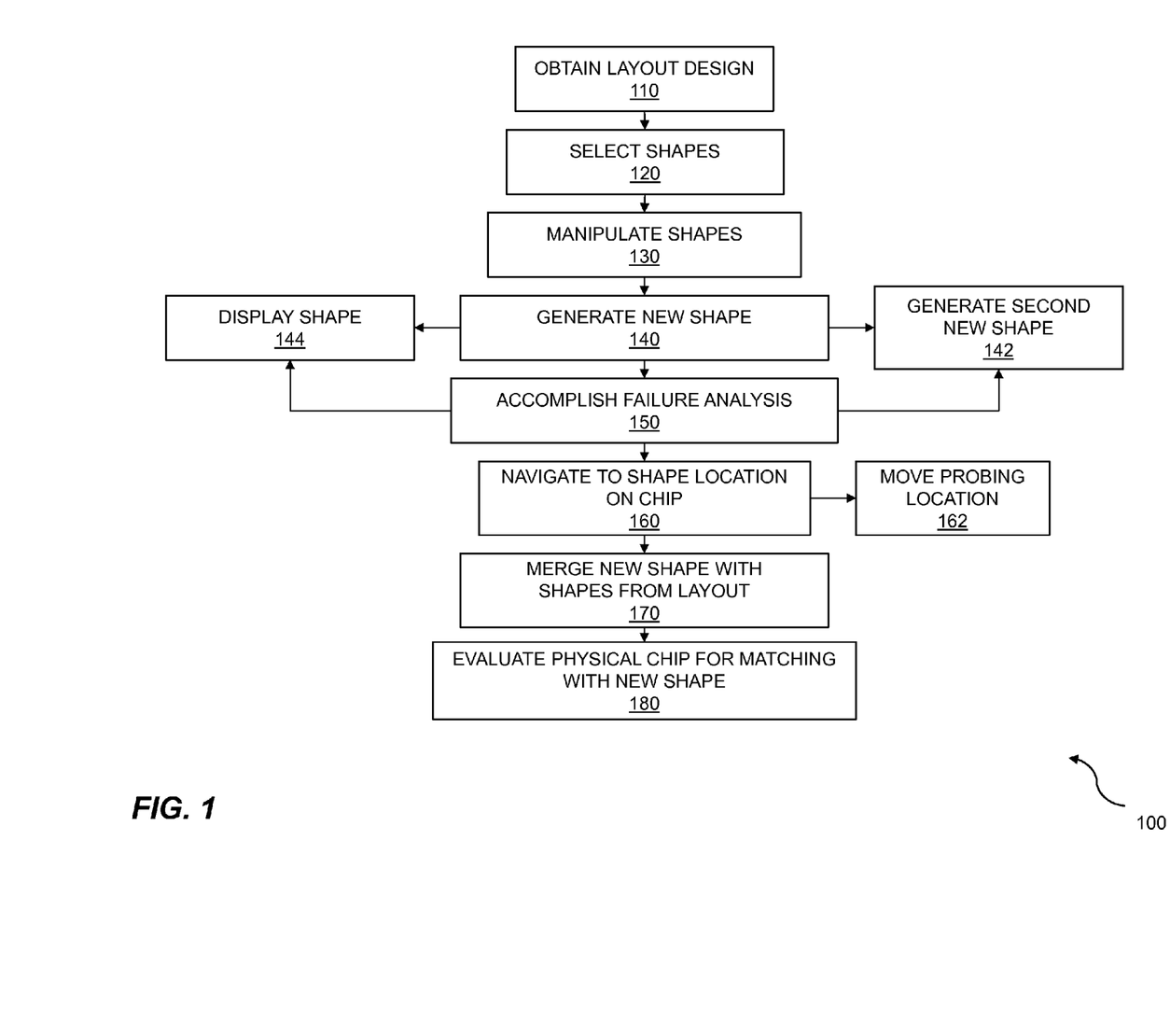
FIG. 1 is a flow diagram for virtual layer generation.

FIG. 1 is a flow diagram for virtual layer generation. The flow 100 comprises a computer-implemented method for design analysis. The flow 100 can include obtaining a layout design 110 for a semiconductor chip. The obtaining can include importing a design and supporting information or it can involve having the design and information already within a software tool. The obtaining can be part of an electronic design automation (EDA) process. The layout design can be in various forms, but in at least some embodiments the layout design comprises one or more computer files that describe multiple layers of a semiconductor design. The layout design can include full information for fabricating a semiconductor chip, or can include only a portion of the information needed to fabricate a semiconductor chip, depending on the embodiment. Each layer of the layout design includes a plurality of shapes, such as, but not limited to, rectangles. In some embodiments, a layer includes the geometric information used for one step in the fabrication process.

The layout design can be obtained by various methods, but in some embodiments the layout design is obtained by reading one or more computer files. In other embodiments, the layout design is obtained over a computer network from another computer, which can be located on the same local network, located remotely and accessed over the internet, or located anywhere and accessed over any topology of communication links using any type of networking or telecommunication protocol. In some embodiments, the layout design is obtained by synthesizing a physical layout from another design file, such as a hardware description file using VHDL™, SYSTEMVERILOG™ or some other type of hardware description file.

The flow 100 also includes selecting a plurality of shapes 120 from the layout design. The selecting can be in response to receiving a layout design for a semiconductor chip. In some embodiments, the plurality of shapes comprises a first set of shapes selected from a first layer of the layout design and a second set of shapes selected from a second layer of the layout design. In other embodiments, the first and second set of shapes are selected based on tags or other parameters associated with the shapes in the layout design. Here it should be noted that more than two different sets of shapes can be selected from the layout design. Therefore, the selecting, from a layout design for a semiconductor chip design, can be for a plurality of shapes from the layout design.

The flow 100 continues with manipulating the plurality of shapes 130 by performing an operation on the plurality of shapes. Any type of operation can be used on the shapes, depending on the embodiment, including compound operations that include multiple manipulations. In some embodiments, the operation is performed between the first set of shapes and the second set of shapes. The operation on the plurality of shapes can include a Boolean operation such as a Boolean AND, OR, MINUS, XOR, and an Intersection function between the plurality of shapes, where the MINUS function is defined as "A" AND NOT "B." In some embodiments, the operation can include blooming, a process by which shapes are enlarged; foreshortening, a process by which shapes are shrunk; misalignment, a process by which the relative location of two shapes is changed; noise, a process which effects random changes to the size and/or location of shapes; necking, a process by which portions of shapes are narrowed; or other operations to simulate possible physical effects and shape changes the physical integrated circuit may undergo during fabrication.

The flow 100 includes generating one or more new shapes 140 based on the manipulating. A new shape is generated as an output of one or more operations on one or more selected shapes. In some embodiments, a new shape or set of shapes is generated based on operations performed on two or more sets of selected shapes. As an example embodiment, three sets of shapes are selected—shapes "A", "B", and "C"—and the operation "Bloom(A) MINUS Foreshorten(B) AND Misalign(C)" is performed. To perform this operation, the shapes contained within set "A" are enlarged by a specified amount and the shapes contained within set "B" are shrunk by a specified amount, with any overlapping areas between the shapes of "A" and the shapes of "B" removed from "A". Then, the location of the set of shapes "C" is adjusted by a specified amount and only overlapping areas of the remaining portion of the shapes of "A" and the shapes of "C" are generated as the new shapes. Thus, the flow 100 can further comprise generating a second new layout shape 142 based on the layout design, or any number of new shapes, depending on the number of selected shapes and the manipulation performed. In some embodiments, the new shapes are displayed 144 to a user and/or are stored for later use.

The flow 100 also includes using the new shape in failure analysis of a semiconductor chip 150 based on the semiconductor chip design. In some embodiments, the new shape represents a feature of an integrated circuit fabricated using the layout design that was obtained. For example, if one selected shape represents a pattern for polysilicon and another selected shape represents a cut poly mask, both of which reside on separate layers in the layout design, performing the operation of polysilicon MINUS cut poly on the two shapes can generate a shape representing the polysilicon that will remain on the final, physical integrated circuit after manufacturing.

As another example, shapes can be selected from a double pattern lithography process. Shapes from a mask layer used to create sacrificial features on the chip can be manipulated to generate intermediate shapes representing outlines of the sacrificial features with a width based on the thickness of the spacer material used in the fabrication process. In this way, the space which the intermediate shapes (sacrificial features) will occupy during an intermediate fabrication phase can be visualized. Then the intermediate shapes can be further virtually manipulated by shapes taken from a mask layer used in a cut process, a process which leaves shapes corresponding to the edges of the shape in the mask used for creating the sacrificial features. In this way, the remaining shapes being thinner and more closely spaced than any shapes within the layers of the layout design, shapes which designers would have been only able to conceptualize during the design phase can be generated virtually. So, the new shape can describe a double pattern lithography shape, and the new shape can be part of a plurality of shapes that are for a double pattern lithography pattern. Given the reality that various fabrication processes, such as double pattern lithography, can create a final element on a semiconductor chip that does not match any shape in the layout design, the disclosed concepts allow the creation of the new shape to be based on a manufacturing intent for the semiconductor chip design. That is, the new shape can represent a shape for a layer not included in the design layout. In such embodiments, the new shape substantially matches a physical shape seen during manufacturing.

Considering that during a failure analysis process, it can be useful to compare the shape of an element on a physical semiconductor chip with the shape of the final intended element of the semiconductor chip, the generated shape can be compared with the actual physical appearance of the manufactured semiconductor chip. To this end, the flow 100 further comprises navigating to a location for the new shape on a physical semiconductor chip 160. The navigating can further comprise moving a probing location 162 to the portion of the physical chip which contains the new shape. Results from probing can then be used to help identify defects. The flow 100 further comprises merging the new shape with another shape from the layout design 170. The merging can create another shape that more accurately corresponds to the shape of the final intended element, in some embodiments. In some cases, the new shape, along with an image of the portion of the physical chip at the location of the element corresponding to the new shape, is displayed to a user performing the failure analysis to allow the user to compare the intended shape with the actual shape on the chip. The comparison can be used to evaluate the physical chip for continuity with the new shape 180. In some situations, the new shape can substantially match a defect and the physical chip can be evaluated for such a defect. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
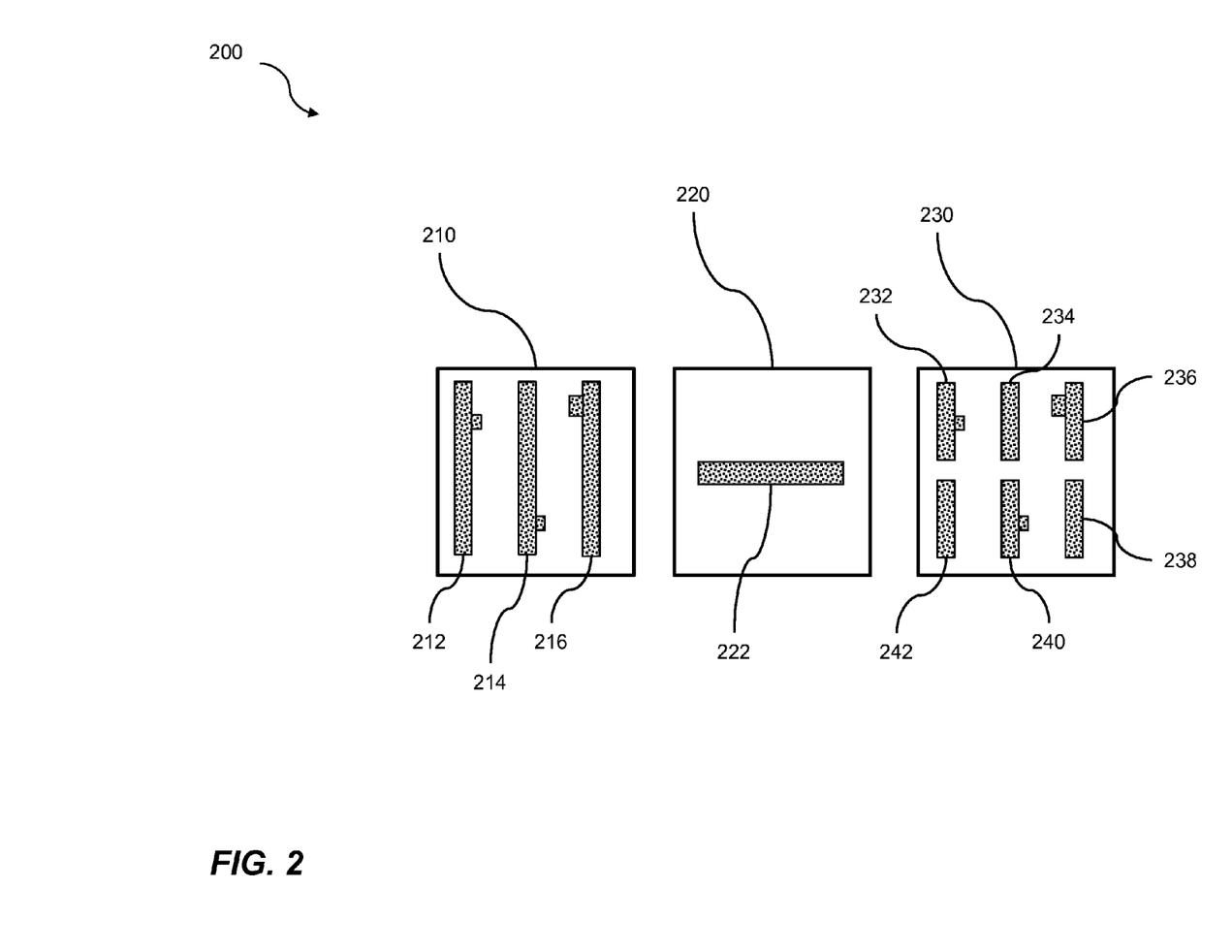
FIG. 2 shows an example polysilicon layer, cut layer, and resultant polysilicon shapes.

FIG. 2 shows an example polysilicon layer 210, cut layer 220, and resultant polysilicon shapes 230. The polysilicon layer 210 is a graphical representation of a portion of a layout design file and includes a first shape 212, a second shape 214 and a third shape 216, each of which have been selected as part of creating a virtual layer. The cut layer 220 is a graphical representation of another portion of a layout design file and includes a fourth shape 222, which has also been selected for creating a virtual layer.

An operation is specified to create virtual shapes based on the selected shapes. The operation on the plurality of shapes can include a Boolean operation on the plurality of shapes, and the Boolean operation can include a subtraction of one of the plurality of shapes from another of the plurality of shapes. In the example shown, a first operation is performed: the first shape 212 MINUS the fourth shape 222, an operation which creates a virtual shape corresponding to the resultant polysilicon shape 232 and a virtual shape corresponding to the resultant polysilicon shape 242. A second operation—the second shape 214 MINUS the fourth shape 222—creates a virtual shape corresponding to the resultant polysilicon shape 234 and the virtual shape corresponding to the resultant polysilicon shape 240. A third operation—the third shape 216 MINUS the fourth shape 222—creates a virtual shape corresponding to the resultant polysilicon shape 236 and a virtual shape corresponding to the resultant polysilicon shape 238. In some embodiments, the virtual shapes generated by the operations can be displayed to a user for comparison to the actual polysilicon shapes on a semiconductor chip. If the virtual shapes and the shape of the actual polysilicon shapes on the semiconductor chip differ, a defect on the chip can be determined to be present.

Figure 3:
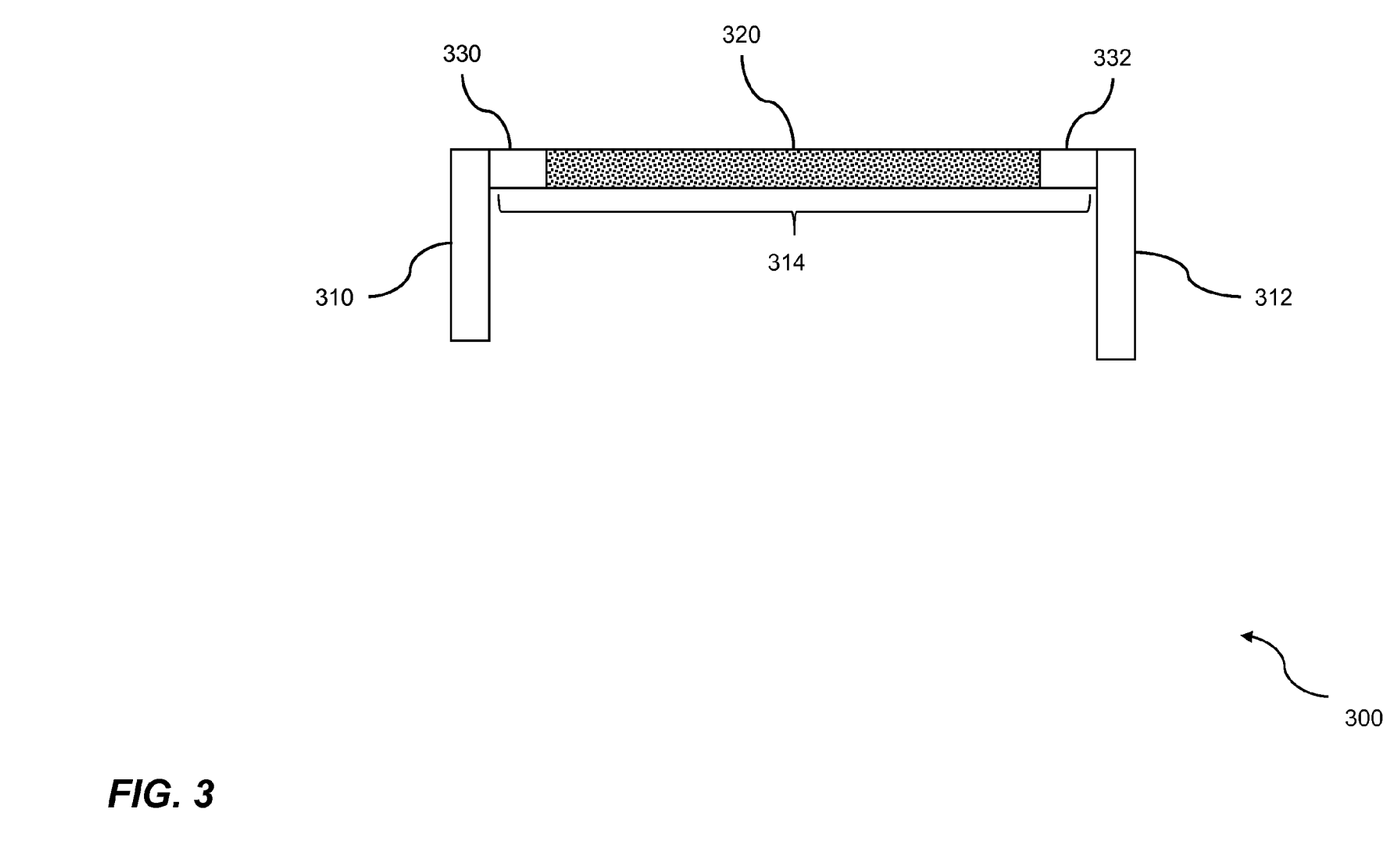
FIG. 3 is an example resistor illustrating a Boolean operation.

FIG. 3 is an example resistor illustrating a Boolean operation. A portion of an electronic design 300 includes shapes on multiple layers. Visible in the portion of the design 300 shown is a shape 314 on a first metal layer, a rectangular shape 314 which is placed between and contacting another shape 310, representing a first lead conductor, and a second shape 312, representing a second lead conductor. The connecting third shape 314 can be a polysilicon shape on a semiconductor. In a case where the third shape 314 is a polysilicon shape on a semiconductor, the shape 330 and the shape 332 are also polysilicon conductors. Also visible in the portion of the design 300 is yet another shape 320 on a second, resistor mask layer. Where a resistor mask overlays a polysilicon shape a resistor results in a circuit implementation.

New shapes are created using Boolean operations between the shapes of the two layers 314 and 320. A first set of new shapes representing conductors can be generated using the shapes of the first layer 310, 312, 314 MINUS the shape of the second layer 320. The first set of new shapes, then, includes the shape 310, the shape 312, the shape 330 and the shape 332, all of which are conductors. A second set of shapes representing a resistor can be generated using a resulting AND of the shape 314 and the shape 320. Thus, the new shape describes a resistor shape within the semiconductor chip design that is contacted by conductors.

Figure 4:
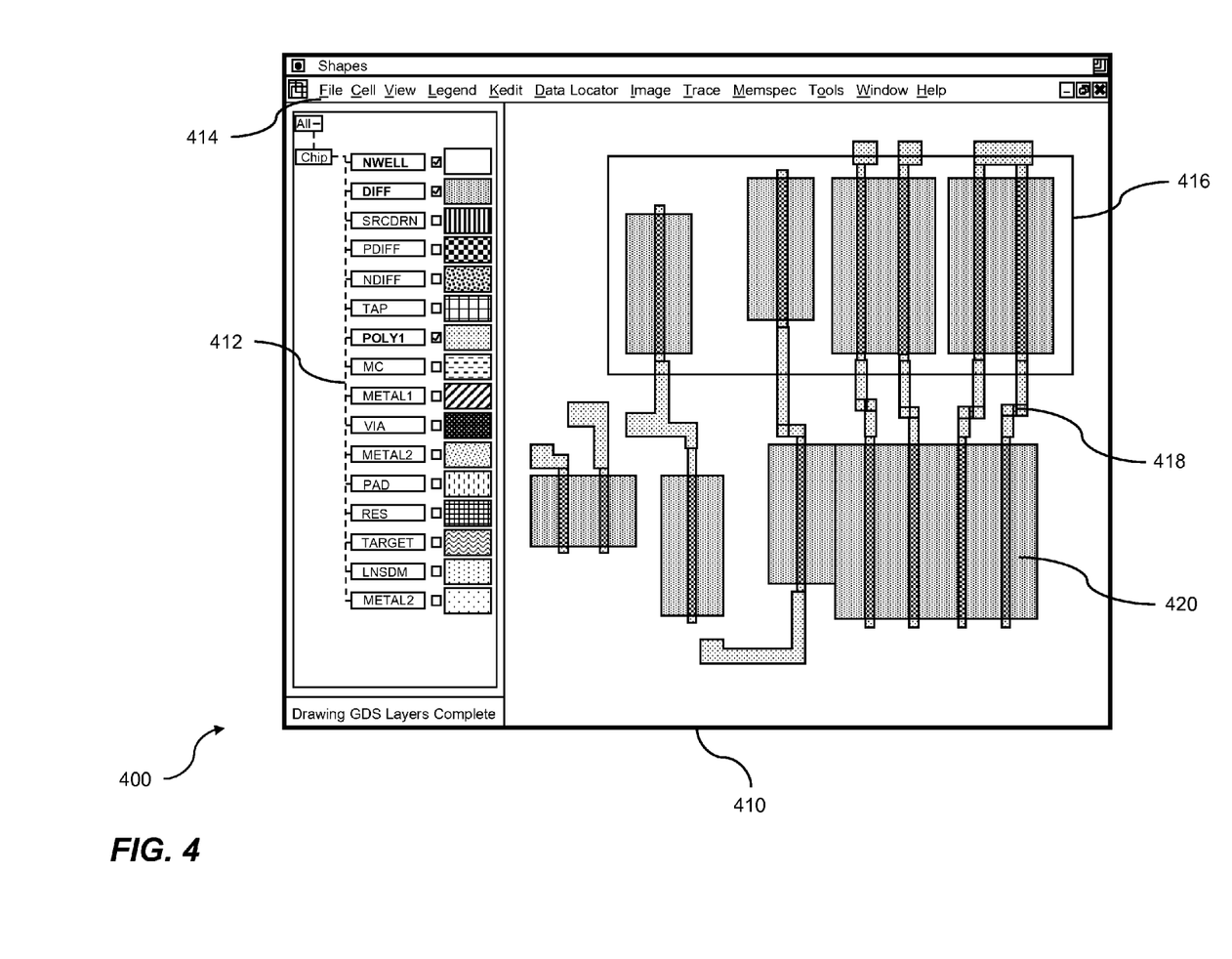
FIG. 4 shows example shapes used to generate new shapes.

FIG. 4 shows example shapes used to generate new shapes. The display screen 400 of an electronic design automation (EDA) system allows a user to view shapes of a layout design and/or virtual shapes generated by operations on the shapes of the layout design. In some embodiments, the display 400 includes one or more windows 410 created by an EDA tool for displaying a particular set of information. Depending on the embodiment, the EDA tool can accept layout designs in different formats. In some embodiments, the layout can include one or more of graphic data system II (GDSII) data, Open Artwork System Interchange Standard (OASIS) data, or Library Exchange Format/Design Exchange Format (LEF/DEF) data. The window 410 includes a user interface 414 such as pull-down menus, buttons, text boxes, and/or other well-known user interface elements to allow the user to select various shapes to view, operations to perform, or ways to otherwise manipulate the data of a design for viewing. The window 410 also includes a menu 412 of different sets of information about the design, such as different layers of the layout design. In embodiments, the menu 412 allows the user to select which layers to display. In the example shown, the NWELL layer, including a rectangular shape 416, the DIFF layer, including a rectangle 420, and the POLY1 layer, including another rectangle 418 are selected for display. In various embodiments, different colors, cross-hatching, outlines, or other indications can be used to differentiate between the different layers.

The example EDA tool can also be used to generate virtual shapes by manipulating a plurality of shapes in the layout design. In some embodiments, a file is read to provide information about how the shapes from different layers are to be manipulated to create virtual shapes. Additionally, other embodiments allow the user to provide information through the user interface 414 to describe how shapes from different layers are to be manipulated to create virtual shapes.

Figure 5:
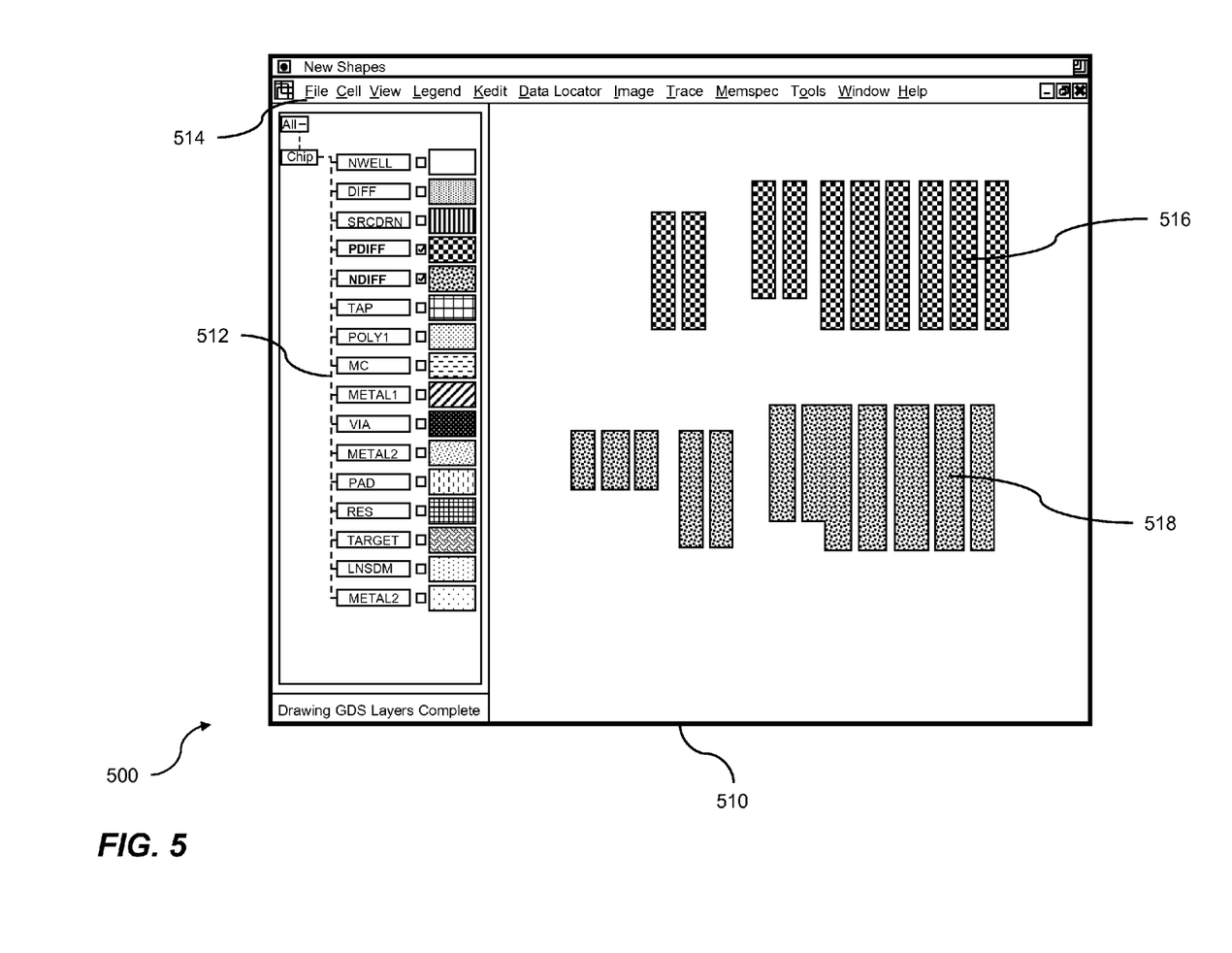
FIG. 5 shows example new shapes.

FIG. 5 shows example new shapes. In some embodiments, the display 500 of an EDA system includes one or more windows 510 for displaying a particular set of information from an EDA tool, such as new shapes. The EDA tool generating the window 510 can be the same tool that was used to generate the window 410 of FIG. 4, but can also comprise a separate EDA tool. The window 510 of the EDA tool includes a user interface 514 to control the operation of the EDA tool and a menu 512 to provide a user the ability to select layers to display as well as the ability to generate a new layout shape based on the layout design. Some embodiments of the EDA tool include the option of generating a second new layout shape based on the layout design. In the example shown, a PDIFF layer has been defined as a virtual layer containing new, or virtual, shapes created from the Boolean operation ((DIFF AND NWELL) MINUS POLY1). The DIFF, NWELL, and POLY1 layers were shown in window 410 of FIG. 4. In the example shown the PDIFF layer has been selected for display in window 510 and includes a set of rectangles such as the rectangle 516. An NDIFF layer has also been defined as a virtual layer containing new, or virtual, shapes created from the Boolean operation ((DIFF MINUS NWELL) MINUS POLY1). The NDIFF layer has been selected to be shown in the window 510 and includes a set of new shapes such as the rectangle 518.

In various embodiments of the EDA tool, the layout design can be manipulated and displayed in many different ways. Various operations such as blooming, foreshortening, necking, noise, or other operations can be applied to shapes from a single mask layer to create new virtual layers that can be displayed and/or used in further operations. Various Boolean operations can be performed using the shapes from two or more layers to create new virtual layers that can be displayed and/or used in further operations, including, but not limited to, AND, OR, XOR, and MINUS (AND NOT) operations.

Figure 6:
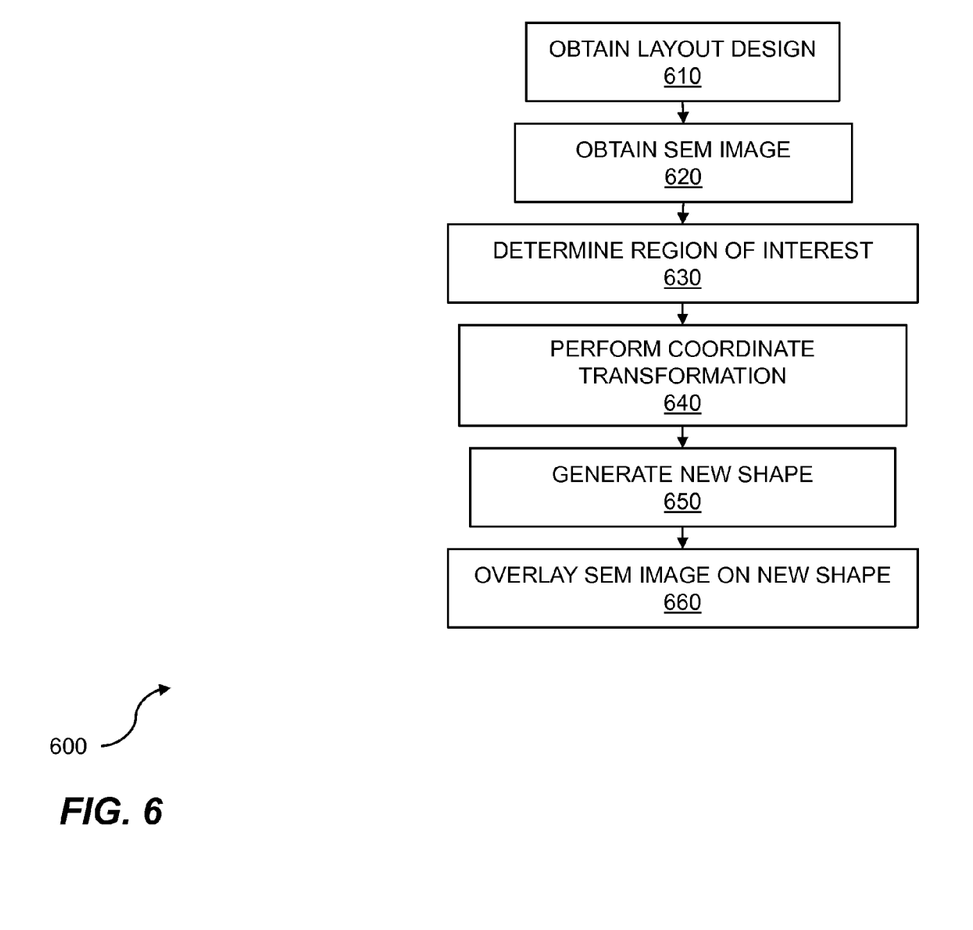
FIG. 6 is a flow diagram for overlaying.

FIG. 6 is a flow diagram for overlaying. The flow 600 describes a computer-implemented method for design analysis. The flow 600 includes obtaining a layout design 610 for a semiconductor chip design. The layout design can be in any form, but in at least some embodiments the layout design comprises one or more computer files that describe two or more layers of a given design. The layout design can include full information for fabricating a semiconductor chip, or can include only a portion of the information needed to fabricate a semiconductor chip, depending on the embodiment. Each layer includes a plurality of shapes, such as, but not limited to, rectangles. In some embodiments, a layer contains the geometric information used for one step in the fabrication process.

The flow 600 continues by obtaining a scanning electron microscope (SEM) image 620. The SEM image can be obtained by any method, but in some embodiments, the SEM image is read from a computer readable storage medium where the image was previously stored. In other embodiments, the SEM image is obtained directly from the SEM in real time as the SEM image is created. Additionally, the SEM image can be further processed to enhance the image using various image processing algorithms, such as edge enhancement, noise reduction, pseudo-coloration, or any other image processing technique. Other embodiments obtain a photo-micrograph or other image from some other type of image capture device, such as an optical microscope, instead of, or in addition to, the SEM image.

The flow 600 can include determining a region of interest 630. The region of interest can be determined by any method, including, but not limited to, selection of a logical circuit entity such as a particular transistor or gate, manual selection of a physical area within the SEM image or the layout design, selection of a particular shape or shapes within the layout design, or any other method. Once the region of interest has been selected, a coordinate transformation of the SEM image can be performed 640 to map the region of interest within the SEM image to a display so that the region can be shown. The coordinate transform can include operations such as resizing, cropping, and rotation, and can also include linear and/or non-linear transformations, depending on the characteristics of the SEM image, the display device, and the region of interest selected, among other criteria.

The flow 600 can also comprise generating a new shape 650 from a plurality of shapes in the layout design. In some embodiments, the new shape or shapes are generated based on shapes from two or more layers using Boolean operations as described previously. Also, the new shapes can be generated only for the region of interest to avoid the processing time required to generate unnecessary new shapes. In some embodiments, the region of interest of both the SEM image of the physical chip and the new shapes are simultaneously displayed to a user. In some embodiments, the region of interest of the physical chip image and the new shapes are displayed side-by-side. In other embodiments, such as the one shown in the flow 600, the displaying includes overlaying a physical chip image, which can be a SEM image, with the new shape 660. Some embodiments allow the user to change the region of interest interactively while displaying both the region of interest of the SEM image of the physical chip and the corresponding region of interest of the new shapes. Additionally, image processing of the SEM image to extract shapes from the SEM image and compare the extracted shapes to the new virtual shaped generated from the layout design can be performed. In embodiments, the comparison generates differences that can be highlighted in the display. In some embodiments, the overlaying includes using a Boolean operation on multiple shapes to create the new shape. The new shape can show an intended semiconductor design after fabrication processes. The new shape can describe a double pattern lithography shape. A defect can be identified based on the physical chip image not substantially matching the new shape. Various steps in the flow 600 may be changed in order, repeated, omitted, or the like without departing from the disclosed concepts. Various embodiments of the flow 600 may be included in a computer program product embodied in a non-transitory computer readable medium that includes code executable by one or more processors.

Figure 7:
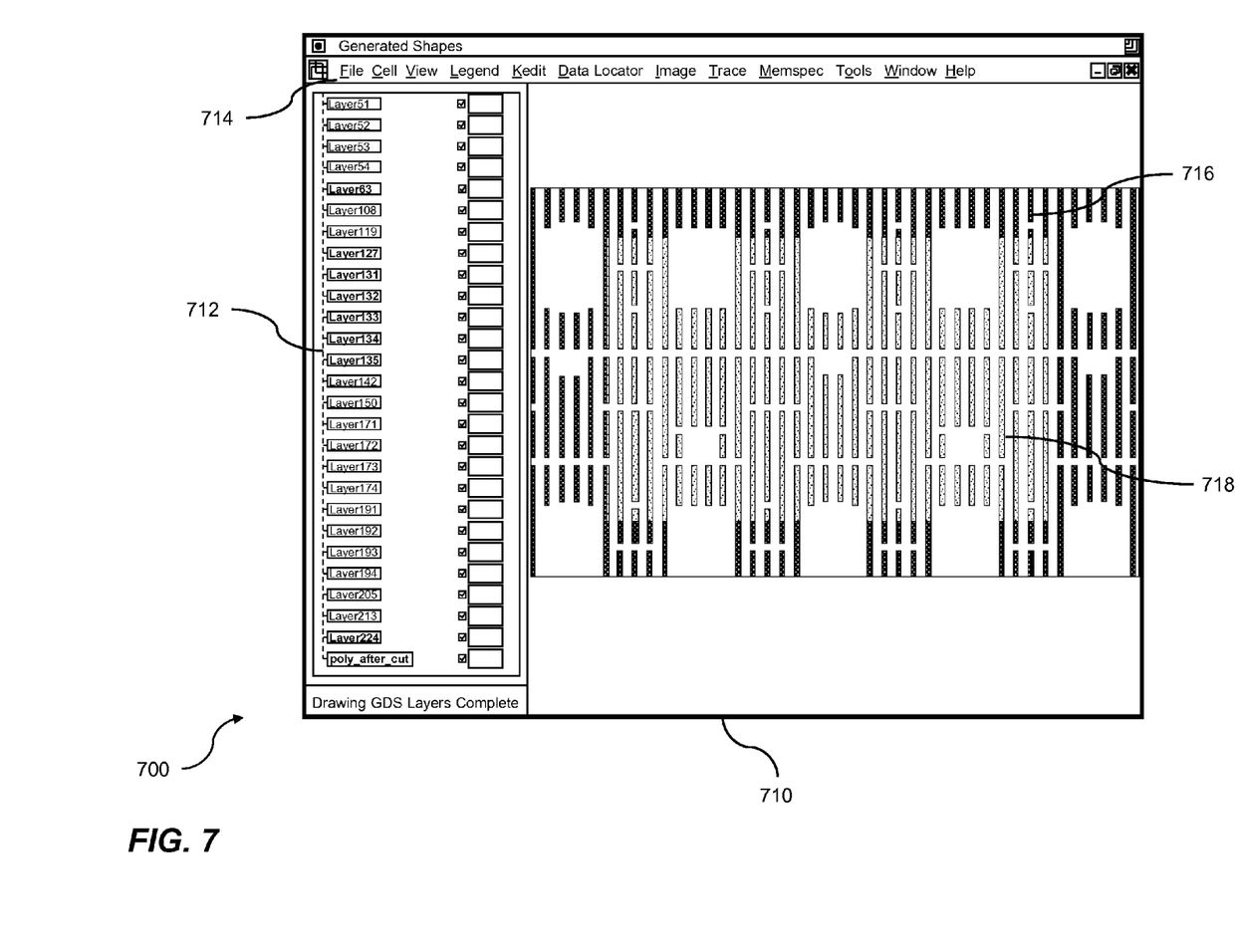
FIG. 7 shows example generated shapes along with chip shapes.

FIG. 7 shows example generated shapes along with chip shapes. In some embodiments, the display 700 of an EDA system includes one or more windows 710 for displaying a particular set of information from an EDA tool. The EDA tool generating the window 710 can be the same tool that was used to generate the window 410 of FIG. 4 and/or the window 510 of FIG. 5, but can also be a separate EDA tool in some embodiments. The window 710 of the EDA tool includes a user interface 714 to control the operation of the EDA tool and a menu 712 to select layers and/or images to display.

In the example shown, new shapes 716 are shown as cross-hatched shapes for a portion of a semiconductor design in the window 710. The new shapes 716 in the window 710 have been generated by manipulating shapes from the layout design of the semiconductor design. A region of interest of a SEM image 718 of a physical chip fabricated based on the semiconductor design is shown as filled shapes in the window 710 with the new shapes 716 overlaid on top of the SEM image 718. The region of interest of the SEM image has been transformed to match the coordinates of the new shapes 716. The transformation allows physical features shown in the SEM image 718 to align with the new shapes 716 corresponding to the physical features. In some embodiments, the SEM image constitutes an image of the surface of the physical chip; thus, using the EDA tool can include evaluating a surface of a physical chip for matching with the new shape.

The new shapes 716 overlaid with the SEM image 718 in the window 710 can be used to identify potential defects in the physical chip. The SEM image 718 shows manufactured shapes. A new shape can substantially match a manufactured shape. If the new shape was generated using operations mimicking the effects of the normal fabrication process, having the new shape substantially match a physical, manufactured shape can indicate that the particular manufactured shapes which correspond to the new shapes have been manufactured correctly, and thus that the resulting semiconductor was fabricated as expected. If the manufactured shape does not substantially match the new shape generated to mimic normal fabrication, the incongruence can indicate that there is a defect in the manufactured shape.

Figure 8:
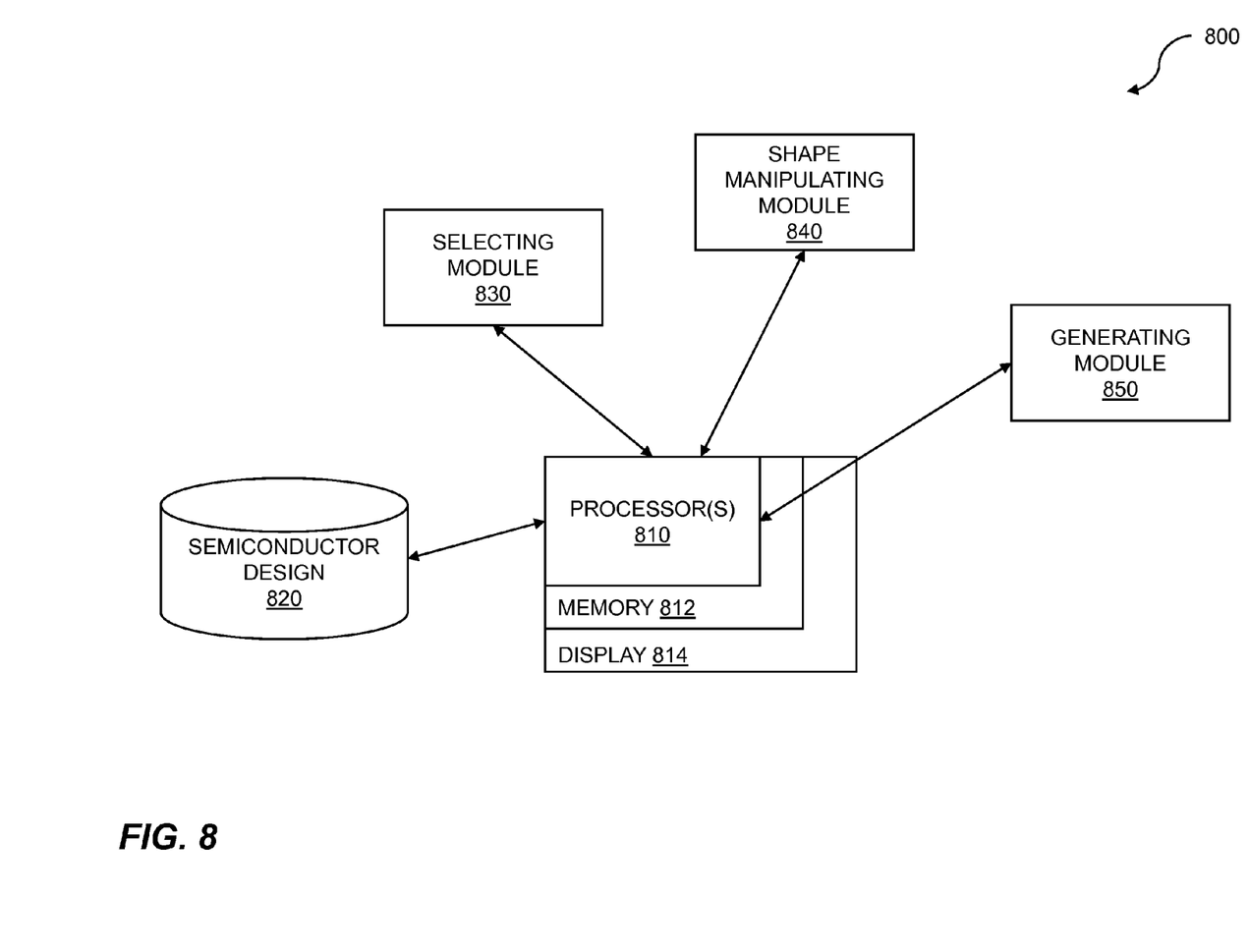
FIG. 8 is a system diagram for virtual layer generation.

FIG. 8 is a system diagram for virtual layer generation. The example system 800 includes one or more processors 810 coupled to a memory 812 which can be used to store computer code instructions and/or data, such as semiconductor design information, layout designs, new shapes generated from shapes in the layout design, images of physical chips, images rendered from information in the layout design, images rendered from new shapes, instructions, intermediate data, chip fabrication information, and the like. A display 814 is also included in some embodiments, and can be any electronic display, including but not limited to, a computer display, a laptop screen, a net-book screen, a tablet screen, a cell phone display, a mobile device display, a remote with a display, a television, a projector, or the like. A semiconductor design 820, which can include a layout design, can be stored on a computer disk or other computer storage medium, where it can be obtained by the one or more processors 810. A selecting module 830 can also be included in the system 800 to select a plurality of shapes from the layout design which is a part of the semiconductor design 820. A shape manipulating module 840 can also be included in the system 800 to manipulate the plurality of shapes by performing an operation on the plurality of shapes. A generating module 850 can also be included in the system 800 to generate a new shape based on the manipulating. In at least one embodiment, the functions of the selecting module 830, the shape manipulating module 840, and the generating module 850 are accomplished or augmented by the one or more processors 810. A user of the system 800 can use the new shape in failure analysis of a semiconductor chip based on the semiconductor chip design.

The system 800 can include a computer program product embodied in a non-transitory computer readable medium for design analysis, the computer program product comprising: code for obtaining a layout design for a semiconductor chip design; code for selecting a plurality of shapes from the layout design; code for manipulating the plurality of shapes by performing an operation on the plurality of shapes; code for generating a new shape based on the manipulating; and code for using the new shape in failure analysis of a semiconductor chip based on the semiconductor chip design. So, the one or more processors, coupled to the memory, can be configured to obtain a layout design for a semiconductor chip design, select a plurality of shapes from the layout design, manipulate the plurality of shapes by performing an operation on the plurality of shapes, generate a new shape based on the manipulating, and use the new shape in failure analysis of a semiconductor chip based on the semiconductor chip design.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
   selecting, from a layout design for a semiconductor chip design, a plurality of shapes from the layout design;
   manipulating the plurality of shapes by performing an operation on the plurality of shapes;
   generating, using one or more processors, a new shape based on the manipulating, wherein the new shape substantially matches a manufactured shape or a defect overlaying a physical chip image with the new shape wherein the overlaying includes using an operation on multiple shapes to create the new shape and wherein the new shape shows an intended semiconductor design after fabrication processes; and
   using the new shape in failure analysis of a semiconductor chip based on the semiconductor chip design.

2. The method of claim 1 wherein the operation on the plurality of shapes includes a Boolean operation on the plurality of shapes.

3. The method of claim 2 wherein the Boolean operation includes a subtraction of one of the plurality of shapes from another of the plurality of shapes.

4. The method of claim 2 wherein the Boolean operation includes an AND, an OR, a MINUS, an XOR, or an Intersection function between the plurality of shapes.

5. The method of claim 1 wherein the new shape describes a double pattern lithography shape.

6. The method of claim 1 wherein the new shape is part of a plurality of shapes that are for a double pattern lithography pattern.

7. The method of claim 1 wherein the new shape is based on a manufacturing intent for the semiconductor chip design and wherein the new shape is for a layer not included in the layout design but where the new shape substantially matches a physical shape seen during manufacturing.

8. The method of claim 1 wherein the semiconductor chip includes a physical semiconductor chip.

9. The method of claim 1 wherein the plurality of shapes are on two or more layers within the layout design.

10. The method of claim 1 further comprising generating a second new layout shape based on the layout design.

11. The method of claim 1 further comprising displaying the new shape.

12. The method of claim 1 further comprising navigating to a location for the new shape on a physical semiconductor chip.

13. The method of claim 12 wherein the navigating further comprises moving a probing location to a portion of the physical semiconductor chip with the new shape.

14. The method of claim 1 further comprising merging the new shape with another shape from the layout design.

15. The method of claim 1 wherein the operation on multiple shapes includes a Boolean operation and the new shape describes a double pattern lithography shape and where a defect is identified based on the physical chip image not substantially matching the new shape.

16. The method of claim 1 further comprising evaluating a surface of a physical chip for matching with the new shape.

17. A computer system for design analysis comprising:
   a memory which stores instructions;
   one or more processors coupled to the memory wherein the one or more processors are configured to:
      select, from a layout design for a semiconductor chip design, a plurality of shapes from the layout design;
      manipulate the plurality of shapes by performing an operation on the plurality of shapes;
      generate a new shape based on the manipulating, wherein the new shape substantially matches a manufactured shape or a defect overlay a physical chip image with the new shape using an operation on multiple shapes to create the new shape and wherein the new shape shows an intended semiconductor design after fabrication processes; and
      use the new shape in failure analysis of a semiconductor chip based on the semiconductor chip design.

18. The computer system of claim 17 further comprising generating a second new layout shape based on the layout design.

19. The computer system of claim 17 further comprising evaluating a surface of a physical chip for matching with the new shape.

20. The computer system of claim 17 wherein the new shape is based on a manufacturing intent for the semiconductor chip design and wherein the new shape is for a layer not included in the layout design but where the new shape substantially matches a physical shape seen during manufacturing.

21. A computer program product embodied in a non-transitory computer readable medium for design analysis comprising code for:
   selecting, from a layout design for a semiconductor chip design, a plurality of shapes from the layout design;
   manipulating the plurality of shapes by performing an operation on the plurality of shapes;
   generating a new shape based on the manipulating, wherein the new shape substantially matches a manufactured shape or a defect overlaying a physical chip image with the new shape wherein the overlaying includes using an operation on multiple shapes to create the new shape and wherein the new shape shows an intended semiconductor design after fabrication processes; and
   using the new shape in failure analysis of a semiconductor chip based on the semiconductor chip design.

22. The computer program product of claim 21 further comprising generating a second new layout shape based on the layout design.

23. The computer program product of claim 21 further comprising evaluating a surface of a physical chip for matching with the new shape.

24. The computer program product of claim 21 wherein the new shape is based on a manufacturing intent for the semiconductor chip design and wherein the new shape is for a layer not included in the layout design but where the new shape substantially matches a physical shape seen during manufacturing.

* * * * *

UNITED STATES PATENT AND TRADEMARK OFFICE
CERTIFICATE OF CORRECTION

| | | |
|---|---|---|
| PATENT NO. | : 9,454,635 B2 | Page 1 of 1 |
| APPLICATION NO. | : 14/604694 | |
| DATED | : September 27, 2016 | |
| INVENTOR(S) | : Ankush Oberai | |

It is certified that error appears in the above-identified patent and that said Letters Patent is hereby corrected as shown below:

In the Specification

Column 1, Line 13, a --;-- should be inserted after the word "defect".

In the Claims

Column 14, Line 13, a --;-- should be inserted after "defect" and before "overlay. Line 14, a --;-- should be inserted after "defect" and before "overlaying".

Signed and Sealed this
Tenth Day of January, 2017

Michelle K. Lee
*Director of the United States Patent and Trademark Office*